(12) United States Patent
Wahler et al.

(10) Patent No.: US 8,982,562 B2
(45) Date of Patent: Mar. 17, 2015

(54) LINE REPLACEABLE UNIT WITH UNIVERSAL HEAT SINK RECEPTACLE

(71) Applicant: GOGO LLC, Itasca, IL (US)

(72) Inventors: Ronald A. Wahler, Boulder, CO (US); Jack Strandquist, Berthoud, CO (US); Donald J. Trotter, Loveland, CO (US)

(73) Assignee: GOGO LLC, Itasca, IL (US)

( * ) Notice: Subject to any disclaimer, the term of this patent is extended or adjusted under 35 U.S.C. 154(b) by 178 days.

(21) Appl. No.: 13/799,869

(22) Filed: Mar. 13, 2013

(65) Prior Publication Data
US 2014/0268576 A1   Sep. 18, 2014

(51) Int. Cl.
*H05K 7/20*   (2006.01)

(52) U.S. Cl.
CPC ....... *H05K 7/20545* (2013.01); *Y10T 29/49117* (2015.01)
USPC ............ 361/715; 361/704; 361/688; 361/719

(58) Field of Classification Search
USPC .......................................... 361/715, 704, 688
See application file for complete search history.

(56) References Cited

U.S. PATENT DOCUMENTS

| | | | | |
|---|---|---|---|---|
| 7,292,441 | B2 * | 11/2007 | Smalc et al. | 361/704 |
| 8,824,144 | B2 * | 9/2014 | Toh et al. | 361/699 |
| 2004/0042179 | A1 | 3/2004 | Murphy | |

* cited by examiner

*Primary Examiner* — Andargie M Aychillhum
(74) *Attorney, Agent, or Firm* — Marshall, Gerstein & Borun LLP

(57) ABSTRACT

A line replaceable unit includes a universal heat sink receptacle formed in an inner surface of a wall of an enclosure. The universal heat sink receptacle is configured to receive a heat spreader for any standard or custom COM Express module so that the line replaceable unit may be efficiently reconfigured with different COM Express modules if needed.

14 Claims, 5 Drawing Sheets

LINE REPLACEABLE UNIT WITH UNIVERSAL HEAT SINK RECEPTACLE

BACKGROUND

1. Technical Field

The invention generally relates to a line replaceable unit and more specifically to a line replaceable unit that has a universal heat sink receptacle for receiving heat spreaders of different types of computer-on-module boards.

2. Related Technology

Line replaceable units (LRUs) are electronic modules that are designed to be replaced or swapped as a unit. Each LRU may include multiple electronic systems. However, each LRU is essentially self contained and configured to be replaced as a unit. LRUs are commonly used in aviation and other transportation industries. For example an aircraft may utilize multiple LRUs, each LRU including electronic components for one or more aircraft systems, such as navigation, communication, pressurization, etc. When a malfunction is detected in a system, maintenance personnel locate the affected LRU containing the suspect components and, once located, the malfunctioning LRU is replaced with a new LRU. Because the LRUs are essentially self contained, swapping a malfunctioning LRU for a new LRU is very efficient, sometimes taking only minutes to complete. As a result, LRUs enhance maintenance reliability for aircraft or other vehicle operations.

LRUs are designed to specifications to assure that they can be interchanged, especially if they are from different manufacturers. Usually a class of LRUs will have coordinated environmental specifications (i.e. temperature, condensation, etc.). However, each particular LRU may also have detailed specifications describing its function, tray size, tray connectors, attachment points, weight ranges, etc. It is common for LRU trays to have connections for rapid mounting, cooling air, power and grounding. The mounting hardware is often manually-removable, standard screw-detent quick-release fittings. Front-mounted electrical connectors are often jacks for ring-locked cannon plugs that can be removed and replaced without tools. Specifications also may define the supporting tools necessary to remove and replace the unit. Many LRUs require no tools for removal and replacement. Most LRUs also have handles, and specific requirements for their bulk and weight. LRUs typically need to be "transportable" and to fit through doors or hatches. There are also requirements for resistance to flammability, limits on unwanted radio emissions, resistance to damage from fungus, limited static electricity emissions, heat limits, pressure limits, humidity limits, condensation drip limits, vibration limits, radiation limits and other environmental factor limits.

LRUs may include one or more computer-on-module (COM) components or boards. A computer-on-module component is a highly integrated and compact PC that may be used in a design application much like an integrated circuit component. Each COM module may integrate core CPU and memory functionality, the common I/O of a PC/AT, USB, audio, graphics (PEG), and/or Ethernet. I/O signals are mapped to two high density, low profile connectors on the bottom side of the module. COM modules are used in LRUs to produce desired functionality for different systems. One type of COM module that is extensively used in aviation LRUs is the COM Express® module. Com Express is a specification hosted by PCI International Computer Manufacturer's group, a consortium computer manufacturing companies.

Generally speaking, COM Express modules have 7 pin out configurations and 4 different module sizes that are based on industry standard specifications. Thus, while having industry standard characteristics, COM Express modules may have different physical layouts. Because COM Express modules are electronic components, they generate heat that must be removed from the COM Express module so that COM Express module is not damaged. Generally, heat is removed from COM Express modules in LRUs by gas convection. More specifically, gas, usually ambient air, is circulated within the LRU and around COM Express module components. This circulating gas removes heat from the COM Express module through convection. While effective, the gas convection systems require a fan or other component to actively move the gas around the COM Express module, which adds weight and complexity to these systems. While heat sinks have been used to remove heat from COM Express modules, these heat sinks have been customized to each individual COM Express module because COM Express modules have different physical configurations or form factors. These customized heat sinks require more custom LRU side panels to be carried in inventory, to accommodate the custom COM Express heat sink form factors, which limits redesign or reconfiguration flexibility of the LRUs themselves.

SUMMARY

A line replaceable unit includes a universal heat sink receptacle formed in an inner surface of a wall of an enclosure. The universal heat sink receptacle is configured to accept any standard COM Express module so that the line replaceable unit may be efficiently reconfigured with different COM Express modules if needed.

In one embodiment, a line replaceable unit includes a container having opposing outer walls, the opposing outer walls have an inner surface and an outer surface. A carrier board may be disposed between the outer walls. A COM Express module may be operatively connected to the carrier board. A heat spreader may be thermally connected to the COM Express module and to the carrier board to spread heat from the COM Express module over a relatively large area. The inner surface of one outer wall includes a universal heat sink receptacle that is sized and shaped to receive the heat spreader, the universal heat sink receptacle being configured to receive more than one type of COM Express module.

In another embodiment, an aircraft local area network system with internet access includes a radio antenna on an aircraft, and a line replaceable unit operatively connected to the radio antenna. The line replaceable unit includes a container having opposing outer walls, the opposing outer walls having an inner surface and an outer surface, a carrier board disposed between the outer walls, a COM Express module operatively connected to the carrier board, and a heat spreader thermally connected to the COM Express module The inner surface of one outer wall includes a universal heat sink receptacle that is configured to receive the heat spreader, the universal heat sink receptacle being configured to receive more than one type of COM Express module. A wireless transceiver for transmitting and receiving wireless signals within the aircraft is communicatively connected to the line replaceable unit for establishing a LAN on board the aircraft.

In another embodiment, a method of changing a COM Express module of a line replaceable unit includes obtaining a line replaceable unit having a first COM Express module and a universal heat sink receptacle disposed on a wall of the line replaceable unit. Removing the first COM Express module from the line replaceable unit. Inserting a second COM Express module into the line replaceable unit, and thermally connecting the second COM Express module with the universal heat sink receptacle, the first COM Express module being a different type or size of COM Express module than the second COM Express module.

BRIEF DESCRIPTION OF THE DRAWINGS

Further features and advantages of the invention can be gathered from the claims, the following description, and the attached diagrammatic drawings, wherein:

DETAILED DESCRIPTION

Figure 1:
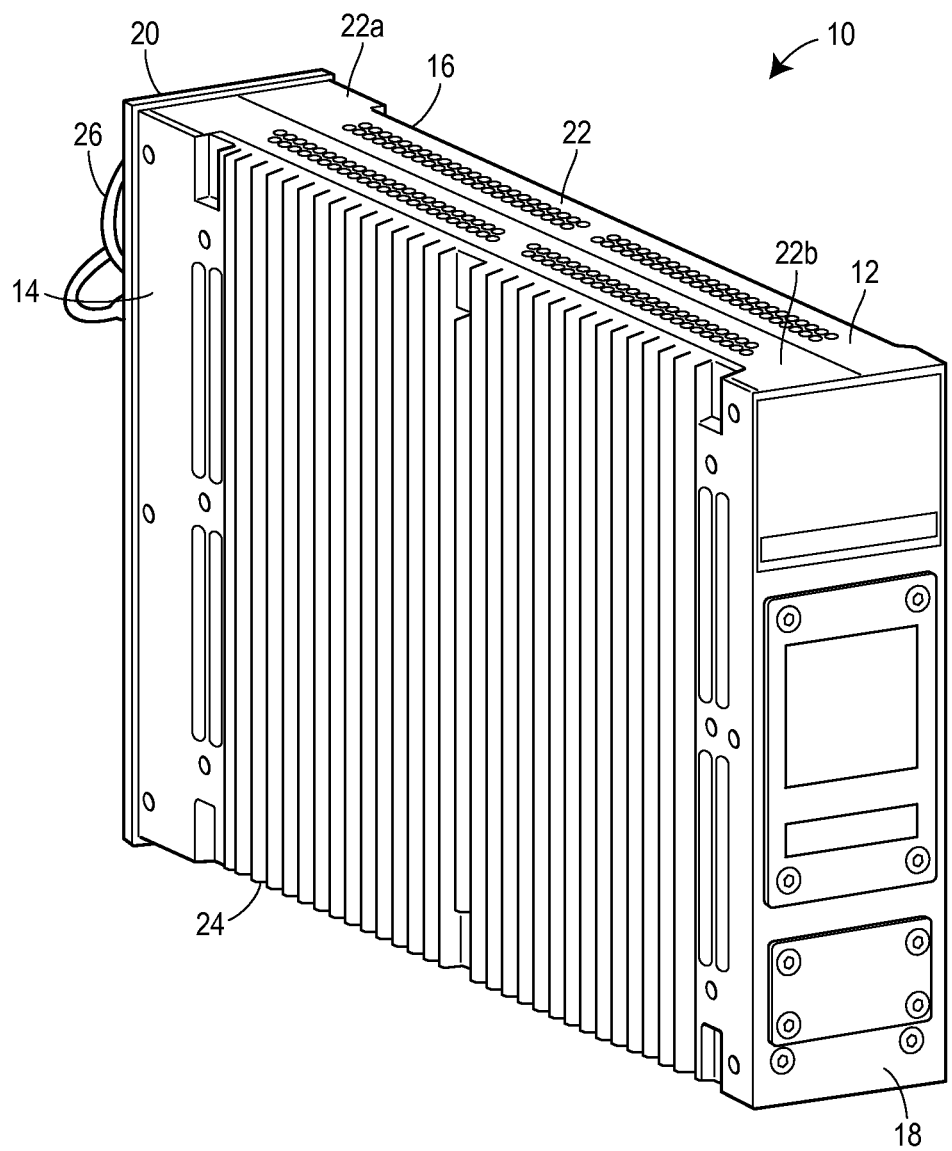
FIG. 1 is perspective view of a line replaceable unit.

Turning now to the FIG. 1, a line replaceable unit (LRU) 10 generally includes an enclosure 12 that defines a space for holding electrical components. The enclosure 12 may include one or more outer walls. For example, the enclosure may include a first outer wall 14 and a second outer wall 16 that are spaced apart from one another. The enclosure 12 may also include a first end wall 18 and a second end wall 20 and a first side wall 22 and a second side wall 24. The first and second side walls 22, 24 may include a first section and a second section (e.g., sections 22a and 22b), which capture a portion (or an edge) of a carrier board 30 (FIG. 2) therebetween. By capturing the carrier board 30 in this manner, the carrier board 30 is secured over a relatively large area, which reduces material stresses on the carrier board 30 when the LRU 10 is subjected to movement and/or temperature or pressure changes. In the embodiment of FIG. 1, the enclosure 12 may have a rectangular box shape. In other embodiments, the enclosure 12 may take on other shapes based on size and/or shape requirements of the location in which the LRU will be used.

The second end wall 20 in the exemplary embodiment of FIG. 1 may include one or more electrical connection ports 26. The electrical connection ports 26 may be used to electrically connect the LRU to other systems, for example, aircraft systems and more specifically for aircraft communication systems, such as on-board internet systems. In one embodiment at least one electrical connection port 26 may be a twist-release cannon plug-type electrical connection port.

Figure 2:
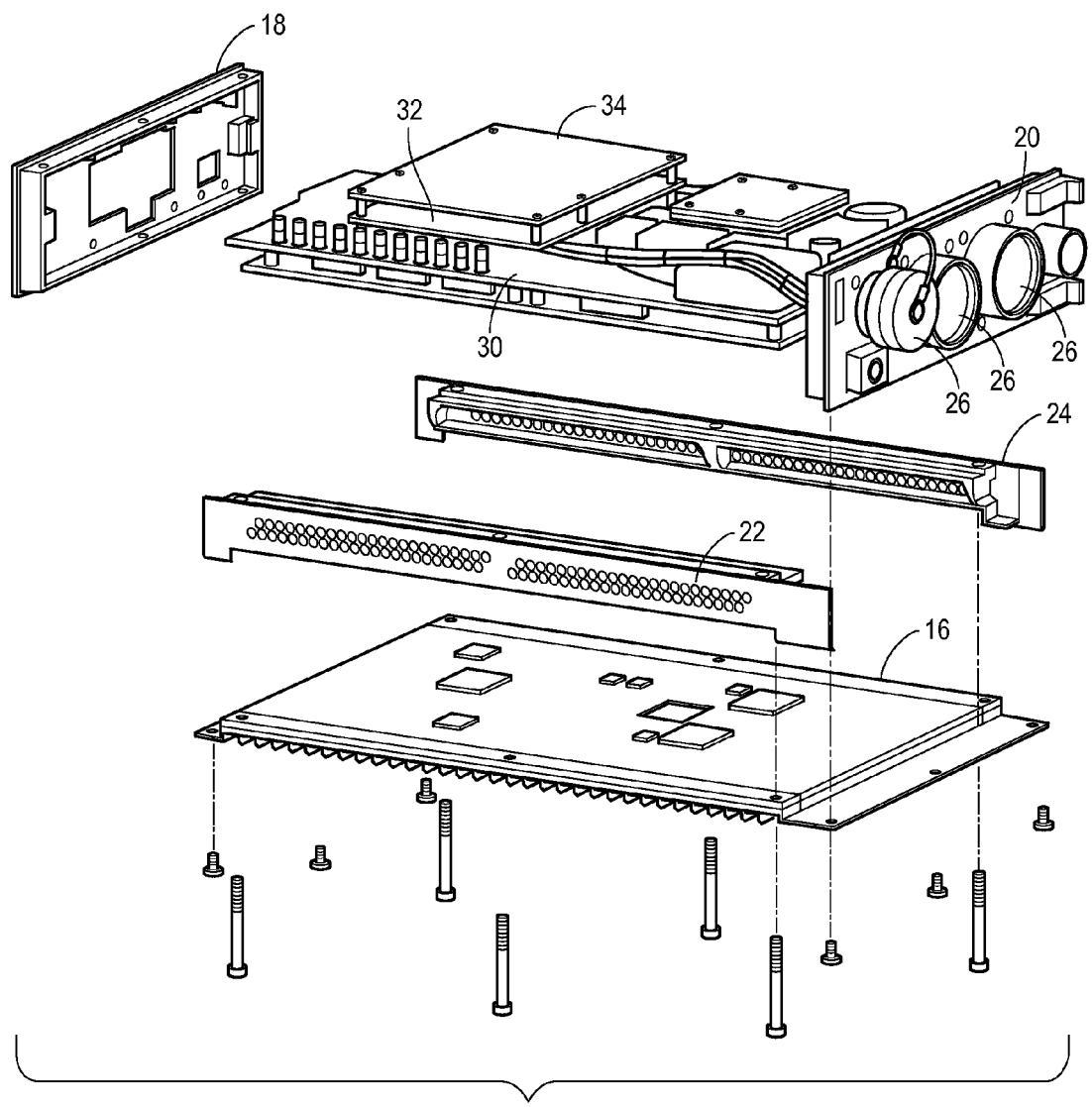
FIG. 2 is a partial exploded perspective view of the line replaceable unit of FIG. 1.
Figure 3:
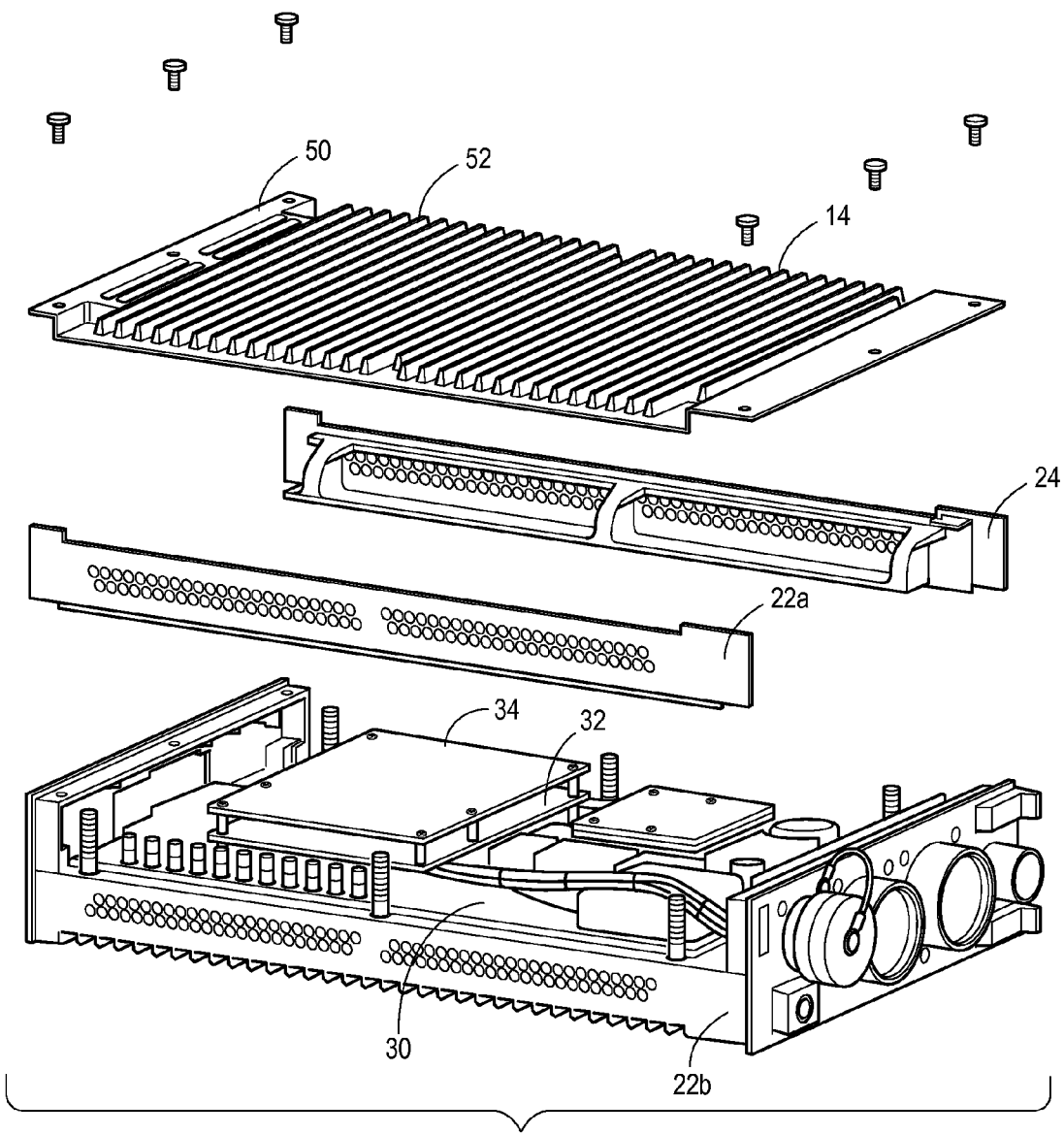
FIG. 3 is a partially exploded perspective view of the line replaceable unit of FIG. 1.

The container 12 may define a space in which electronic components may be located. For example, as illustrated in FIGS. 2 and 3, the container 12 may house a base board or carrier board 30 that includes multiple circuits and/or electrical connections for sub-components. The carrier board 30 may be electrically connected to the one or more connection ports 26. The carrier board 30 may receive a COM Express module 32. A heat spreader 34 may be thermally connected to the COM Express module 32. The heat spreader 34 spreads heat generated by the COM Express module 32 over a relatively wide area to enhance heat removal from the COM Express module 32 and to dissipate heat into the outer wall 14, 16 and eventually into heat dissipating elements, such as radiating fins 52 (FIG. 3).

Figure 4:
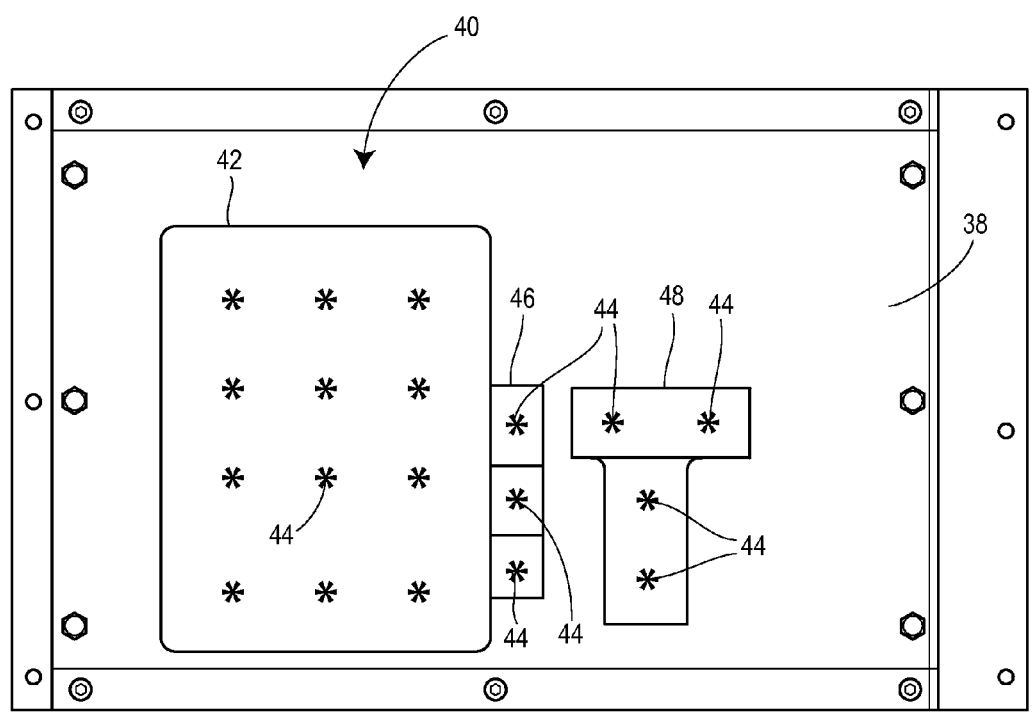
FIG. 4 is a plan view of an internal wall surface of an outer wall of the line replaceable unit of FIG. 1, the internal wall surface including a universal COM module heat sink receptacle.

An inner surface 38 (FIG. 4) of one side wall 14 may include a universal heat sink receptacle 40. The universal heat sink receptacle 40 may include a primary recessed slot 42 that is sized to accept standard COM Express heat spreaders 34 or custom COM Express heat spreaders 34. In one embodiment, the primary recessed slot 42 is approximately 125 mm high by approximately 95 mm wide, which is the size of a standard COM Express heat sink form factor. A thermal connecting element, such as thermally conductive adhesive or paste 44, may be disposed between the recessed slot 42 and the COM Express heat spreader 34 to secure the COM Express heat spreader 34 and to enhance transfer of heat from the COM Express module 32 to the wall 14 of the LRU 10. In other embodiments, the COM Express heat spreader 34 may be thermally connected to the primary recessed slot 42 by other types of thermally conductive elements. In the embodiment illustrated in FIG. 4, the thermally conductive paste 44 secures the COM Express heat spreader 34 to the recessed slot 42, and thus thermally connects the COM Express heat spreader 34 to the wall 14 and to the heat radiating fins 52 on the wall 14. In one embodiment, twelve applications of thermally conductive paste 44 may be arranged in a three by four grid within the primary recessed slot 42. In some embodiments, the universal heat sink receptacle 40 may include one or more thermally conductive towers 46, 48 that extend inwardly from the inner surface 38 of the wall 14. The thermally conductive towers are sized and shaped to contact specific chip sets on the carrier board 30 for removing heat from the specific chip sets. A first thermally conductive tower 46 may be located adjacent the primary recessed slot 42. In some embodiments, the first thermally conductive tower 46 may be configured to receive at least three applications of thermally conductive paste 44 that are arranged in a line. In other embodiments, a second heat removal tower 48 may be spaced apart from the primary recessed slot 42 and from the first heat removal tower 46 by a distance. The second heat removal tower 48 may be generally T-shaped, and configured to receive at least four applications of thermally conductive paste 44 arranged in two pairs that are oriented substantially perpendicularly to one another. The second thermally conductive tower 48 may be used to remove heat from other components The disclosed universal heat sink receptacle 40 advantageously is sized and shaped to receive any standard (or custom) COM Express heat spreader 34 that may be used in the LRU 10. As a result, COM Express modules and respective heat spreaders 34 may be swapped into and out of the LRU 10 without replacing or reconfiguring the universal heat sink receptacle 40 or without replacing a side 14 of the LRU.

Heat removed from the COM Express heat spreaders 34 may be conducted through the thermally conductive paste 44, into the primary recessed slot 42, into the side wall 14, and ultimately into the heat radiating fins 52 and then into the surrounding atmosphere. An outer surface 50 (FIG. 3) of the side wall 14 may include one or more heat radiating fins 52. The heat radiating fins 52 enhance heat transfer with the surrounding atmosphere, thus enhancing heat removal from the LRU 10 and from the COM Express heat spreaders 34.

Figure 5:
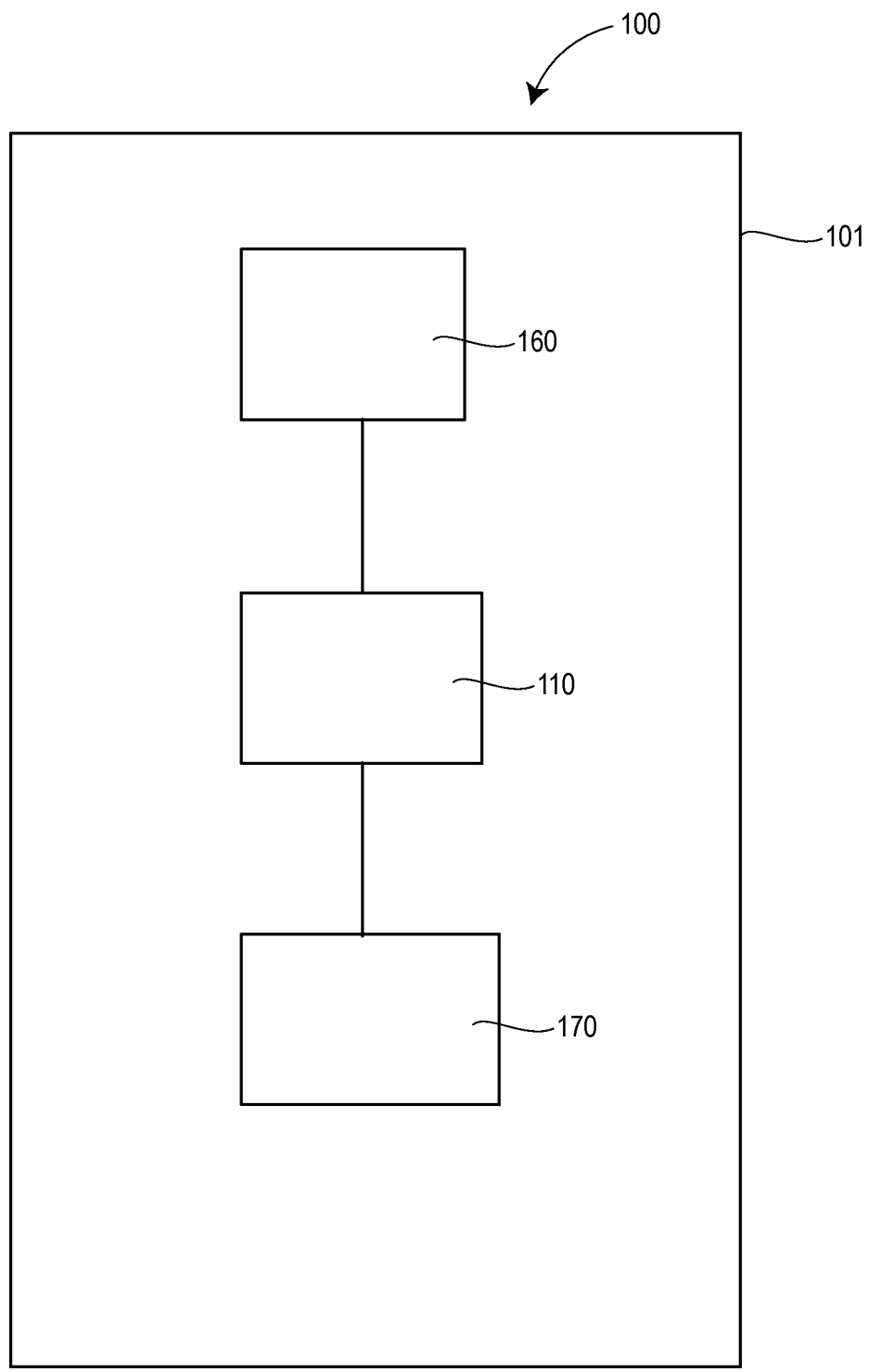
FIG. 5 is a schematic diagram of an aircraft on-board wireless LAN system including a line replaceable unit having a universal heat sink receptacle.

FIG. 5 illustrates one embodiment of a local area network system 100 for an aircraft 101. The local area network system 100 may include a communications antenna 160 located on an outer surface of the aircraft 101, a line replaceable unit 110 communicatively connected to the communications antenna 160, and a LAN transceiver 170 communicatively connected to the LRU 110. The LRU 110 communicates with ground based or satellite based systems to access the internet through the communications antenna 160. Similarly, the LRU 110 communicates with user input/output devices, such as PDA's, cell phones, smart phones, laptop computers, or tablet computers through the LAN transceiver 170, which establishes a LAN for the aircraft 101. The LRU 110 may include the universal heat sink receptacle 40 described above so that the LRU 110 may be efficiently reconfigured with different COM Express modules if needed.

The disclosed line replaceable units and universal heat sink receptacles solve the problem of having to redesign custom heat sinks when swapping out one COM Express module for another COM Express module in a line replaceable unit. The disclosed line replaceable units and universal heat sink receptacles solve this problem by having a side panel universal heat sink receptacle that accepts a standard (or custom) foot print COM Express heat spreader in a recessed slot on the side panel. Thus, any standard (or custom) COM Express module may be incorporated into the mechanical enclosure of the LRU without redesigning the side panel or the heat sink.

The disclosure is not limited to aircraft line replaceable units. The disclosure could be applied to virtually any line replaceable unit having a heat sink that is configured to remove heat from one or more different types of COM Express modules. The features of the invention disclosed in the description, drawings and claims can be individually or in various combinations for the implementation of the different embodiments of the invention.

The invention claimed is:

1. A wall for a line replaceable unit, the wall comprising: an inner surface and an outer surface; at least one heat radiating fin disposed on the outer surface; and a universal heat sink receptacle formed on the inner surface, the universal heat sink receptacle being configured to receive a heat spreader of a COM module, the universal heat sink receptacle being sized and shaped to receive more than one type of COM module, wherein the universal heat sink receptacle is configured to remove heat from the heat spreader without a fan by conducting heat from the heat spreader, through the inner and outer surfaces of the wall, and into the at least one heat radiating fin; wherein a second heat conducting tower is spaced apart from the primary recessed slot, the second heat conducting tower being configured to remove heat from a heat sink of another component; wherein the second heat conducting tower is configured to receive a plurality of applications of thermally conducting paste arranged in a T-formation on the second heat conducting tower, wherein the second heat conducting tower is configured to receive two sets of two applications of thermally conductive paste disposed on the second heat conducting tower, each set of applications being arranged in a line that is substantially perpendicular to the other set of applications.

2. The wall of claim 1, wherein the universal heat sink receptacle includes a primary recessed slot that is sized and shaped to accept a heat spreader of any standard COM module.

3. The wall of claim 2, wherein the universal heat sink receptacle is configured to receive a plurality of applications of thermally conductive paste between the wall and a COM module.

4. The wall of claim 3, wherein the universal heat sink receptacle is configured to receive an application of thermally conductive paste arranged in a three by four grid of applications.

5. The wall of claim 4, wherein the universal heat sink receptacle further comprises a first heat conducing tower disposed adjacent to the primary recessed slot, the first heat conducting tower being sized and shaped to contact another heat generating component.

6. The wall of claim 5, wherein the first heat conducing tower is configured to receive a set of three applications of thermally conductive paste arranged in a line on the first heat conducing tower.

7. The wall of claim 1, wherein the second heat conducting tower is T-shaped.

8. The wall of claim 1, wherein the outer surface includes a plurality of heat dissipating elements.

9. The wall of claim 8, wherein at least one of the heat dissipating elements is a heat radiating fin.

10. The wall of claim 8, wherein heat is conducted from the universal heat sink receptacle to the heat dissipating element through the outer wall.

11. The wall claim 1, wherein the universal heat sink receptacle is configured to be coupled to two or more types of COM modules that are selected from the group consisting of a mini module, a compact module, a basic module, and an extended module.

12. The wall of claim 1, wherein the universal heat sink receptacle is rectangular in shape measuring approximately 125 mm by approximately 95 mm.

13. An aircraft local area network system with internet access, the system comprising: a radio antenna on an aircraft; a line replaceable unit operatively connected to the radio antenna, the line replaceable unit including a container having opposing outer walls, the opposing outer walls having an inner surface and an outer surface, a plurality of heat radiating fins disposed on the outer surface of at least one of the outer walls, a carrier board disposed between the outer walls, a COM module operatively connected to the carrier board, and a heat spreader operatively connected to the COM module, wherein the inner surface of the at least one outer wall includes a universal heat sink receptacle that is configured to remove heat from the heat spreader without a fan by conducting heat from the heat spreader through the at least one outer wall and into the heat radiating fins, the universal heat sink receptacle being configured to receive the heat spreader, and the universal heat sink receptacle also being configured to receive more than one type of COM module; and a wireless transceiver for transmitting and receiving wireless signals within the aircraft, the wireless transceiver being communicatively connected to the line replaceable unit;

wherein the universal heat sink receptacle is configured to receive a plurality of applications of thermally conducting paste between the universal heat sink receptacle and the COM module.

14. The system of claim 13, wherein the applications of thermally conducting paste are configured in a three by four grid.

* * * * *